United States Patent [19]
Lee

[11] Patent Number: 5,270,240
[45] Date of Patent: Dec. 14, 1993

[54] FOUR POLY EPROM PROCESS AND STRUCTURE COMPRISING A CONDUCTIVE SOURCE LINE STRUCTURE AND SELF-ALIGNED POLYCRYSTALLINE SILICON DIGIT LINES

[75] Inventor: Roger R. Lee, Boise, Id.

[73] Assignee: Micron Semiconductor, Inc., Boise, Id.

[21] Appl. No.: 942,707

[22] Filed: Sep. 9, 1992

Related U.S. Application Data

[63] Continuation-in-part of Ser. No. 727,702, Jul. 10, 1991, Pat. No. 5,149,665.

[51] Int. Cl.[5] .............................................. H01L 21/70
[52] U.S. Cl. ...................................... 437/52; 437/43; 437/48; 437/195; 257/321
[58] Field of Search ................ 437/43, 48, 52, 191; 257/315, 321

[56] References Cited

U.S. PATENT DOCUMENTS

| | | | |
|---|---|---|---|
| 4,590,665 | 5/1986 | Owens et al. | 437/43 |
| 4,642,881 | 2/1987 | Matsukawa et al. | 257/321 |
| 4,872,041 | 10/1989 | Sugiura et al. | 257/316 |
| 4,892,840 | 1/1990 | Esquivel et al. | 437/48 |
| 4,949,309 | 8/1990 | Rao | 257/316 |
| 5,019,527 | 5/1991 | Ohshima et al. | 437/43 |
| 5,047,362 | 9/1991 | Bergemont | 437/43 |
| 5,081,056 | 1/1992 | Mazzali et al. | 437/43 |

FOREIGN PATENT DOCUMENTS

| | | | |
|---|---|---|---|
| 2129611 | 5/1984 | Japan . | |
| 0152673 | 6/1989 | Japan | 437/43 |

Primary Examiner—Tom Thomas
Attorney, Agent, or Firm—Stanley N. Protigal

[57] ABSTRACT

A process and structure for an electrically erasable programmable read-only memory is described. The PROM is manufactured with four poly layers, the poly layers forming the floating and control gates, a structure coupling isolated source areas, and the fourth layer forming the digit lines. The inventive structure allows for a self-aligned poly source line which removes the need for an etch of the field oxide which is required in conventional EEPROM designs, which are known to be difficult to control. The poly digit line is also self-aligned and has a large margin of misalignment error in an etch to expose the drain region of the substrate.

21 Claims, 13 Drawing Sheets

FOUR POLY EPROM PROCESS AND STRUCTURE COMPRISING A CONDUCTIVE SOURCE LINE STRUCTURE AND SELF-ALIGNED POLYCRYSTALLINE SILICON DIGIT LINES

CROSS REFERENCE TO RELATED APPLICATION

This is a continuation-in-part of U.S. patent application Ser. No. 727,702, filed Jul. 10, 1991, now U.S. Pat. No. 5,149,665.

FIELD OF THE INVENTION

The disclosed invention relates to the field of programmable read only memories. More specifically, it describes a structure and process for use with flash electrically erasable programmable read-only memories ($E^2$PROMs) which has advantages over prior structures.

BACKGROUND OF THE INVENTION

EPROMs and Flash $E^2$PROMs (hereafter collectively, PROMs) have several structures which allow them to hold a charge without refresh for extended periods of time (see FIG. 1). The charge itself is stored on a "floating gate" 10 also referred to as Poly 1 or P1, which is a structure of polycrystalline silicon (hereafter, poly) surrounded on all sides by a layer of oxide 12. Located superjacent and parallel to this P1 structure is another poly structure, the word line or "control gate" 14 or P2. P1 10 and P2 14 act as the two plates of a capacitor. Below the P1 layer are two N+ junctions, one which acts as the transistor source 16 and the other as the drain 18, which are doped into a p-type substrate 20. The portion of the substrate 20 between the source 16 and the drain 18 is the channel 22. The cell of FIG. 1 functions like an enhancement-type n-channel metal oxide semiconductor field effect transistor (MOSFET) with two gates of poly.

There are many ways to program a flash $E^2$PROM. For example, a potential such as 8 V is applied between source and drain. Simultaneously, a large voltage pulse, for example 12 V, is applied to the control gate. The large positive voltage on the control gate establishes an electric field in the insulating oxide. This electric field attracts the electrons generated from the so-called avalanche breakdown of the transistor due to the high drain and control gate voltages, and accelerates them toward the floating gate, which they enter through the oxide. In this way the floating gate is charged, and the charge that accumulates on it becomes trapped.

To return the floating gate from a charged state to a state with no charge, the charge is returned to the substrate. In an EPROM, this is accomplished with ultraviolet light which excites the electrons on the floating gate past a certain energy state, thereby allowing them to pass through the oxide and return to the substrate. In an $E^2$PROM, this excitation is accomplished with an electrical field.

The voltage which must be applied on the control gate to turn on the transistor is much higher in a device storing a charge than in a device which does not have a voltage potential stored on P1. To read the content of the floating gate, a voltage somewhere between the low and high voltage values (i.e. the threshold voltage $V_t$) is applied to the control gate. A cell that trips at $V_t$ has no charge stored on P1, while a cell which does not trip is determined to be storing a charge.

There are structures which make up a PROM array which are common to several transistors in the array. FIG. 2 shows a top view of an array showing transistor sources 16, drains 18, digit lines 24, floating gates 10, and control lines 26 which form control gates 14 as they pass over the floating gates 10. Also shown as a dotted line is the "active area" 28 interspersed with areas of field oxide 30. As shown in FIG. 2, a single control line 26 is common to all transistors in a single column, and when selected it activates all transistors in the column. The source regions 16, which run parallel with the control lines 26, are common to all transistors in two adjacent columns, although all source regions are the same point electrically across all transistors in the array or in a portion of the array. Individual transistor drains 18 are common to two transistors in adjacent columns. The digit (or bit) lines 24 are common with the drains 18 of all transistors in a single row.

To read the datum on a floating gate 10, the control line 26 of the cell to be read is activated which causes all transistors in the selected column to become active and to output the cell information on their respective digit lines 24. The information on the digit line 24 which corresponds to the cell to be read is obtained with a sense amplifier (not shown), with one sense amp for each digit line.

The "active area" 28 is defined during the manufacturing process after the thin pad oxide is initially formed on the surface of the wafer. After the pad oxide is formed on the surface of the wafer, a patterned layer of nitride is formed and the exposed oxide is caused to thicken. The nitride prevents the growth of the oxide underneath it, while allowing the exposed oxide to grow. The area under the nitride which remains thin is referred to as the gate oxide and is also called the active area. The exposed oxide which thickens becomes the field oxide. During an oxide etch, the gate oxide will erode away to bare silicon, as it is thinner than the field oxide. The bare areas can then be doped, with the field oxide protecting the other silicon areas from being doped.

FIG. 2 shows a conventional correctly-aligned PROM array. After the transistor control lines 26 and floating gates 10 and spacers (not shown) are formed, the surface of the wafer is doped so as to define the transistor sources 16 and the drains 18. "W" shows the minimum width of the source line which is formed during the doping. The width is determined by the width of the active area 28 which is doped, and is defined on the two outer edges by the field oxide which cannot be doped through, and on the two inner edges by the spacer oxide (not shown) covering the word lines 26.

There are various problems associated with the manufacture of present designs of PROMs, not the least of which is misalignment of surface structures with respect to the active area. For example, the control gates 26 can be misaligned so that they cover some of the active area 28 as shown in FIG. 3. The active area 28 covered by the misaligned control gate poly 26 is designated by a "P." This control gate poly 26 which covers the gate oxide P protects the gate oxide in this region from being etched away and the substrate below it from being doped. In this misaligned configuration, the doped area which makes up the source lines are greatly narrowed, and are indicated by W' in FIG. 3. If the control gates 26 are misaligned in this way, the floating gates 14 are also misaligned since the structures are formed by the same etch, thereby resulting in unfavorable changes to the electrical characteristics of the device. Conductivity along the source lines 28 decreases due to the increased resistivity which results from the narrowed lines. Also, there is a greater chance of interference between the digit lines 24 from the reduced conductivity path between drains 18 in adjacent rows.

There are currently two primary methods used to manufacture Flash E²PROM and EPROM memory. A first manufacturing process is shown in FIGS. 4-8.

To get to the structure of FIG. 1, a first blanket layer of oxide, the pad oxide, is formed on top of the silicon substrate. Nitride is patterned in a crisscross pattern on the oxide to define the active area 28 as shown in FIG. 4, and the field oxide 30 is formed from the exposed pad oxide while the unexposed pad oxide becomes the gate oxide 28. As shown in FIGS. 5A and 5B, a first blanket layer of poly 50 which will make up P1 is formed on the appropriate areas of the gate oxide 28, and a second layer of oxide 52 and a layer of nitride 54, which separate P1 from a second poly layer is formed on the first poly layer 50. The P1 layer is patterned with a layer of resist 56 in rows, perpendicular to the source lines of the active area. As shown in FIG. 6, after a P1 sidewall oxidation (not shown) a second blanket poly layer 60, P2, is formed on the nitride layer 54, and an optional oxide layer 62 is formed on the Poly 2 60 layer, and photoresist 64 is patterned on the surface in columns perpendicular to the rows of P1 50. An etch forms the floating gates 10 and control gates 14. Referring to FIG. 7, a third blanket layer of oxide 70 is formed and etched, which forms the spacers 80 as shown in FIG. 8. During the spacer etch, exposed gate oxide 28 is also removed, thereby exposing the areas of silicon which will later become the transistor diffusion areas.

After the structure of FIG. 8 is formed, the substrate 20 is doped to form the N+areas of the transistor sources 16 and drains 18, and conductive areas which couple the sources between the rows. Next, a blanket layer of oxide is formed over the wafer surface, and a patterned layer of resist defines the digit line contacts to the drain regions. An etch is performed down to the substrate which removes any exposed material and defines the contacts. Finally, the resist is removed and a layer of metal is deposited.

With this process, misalignment can occur when the photoresist 64 is deposited which defines the control gates 14. If the mask used to pattern the photoresist 64 is misaligned, the structure of FIG. 3 might be produced, which has the problems of high resistivity which were described above. Misalignment can also occur during the formation of the photoresist which defines the digit lines. If the mask is misaligned, the destructive etch can expose the floating gate which would then make contact with the digit line, thereby producing an unusable wafer of devices. For this reason, the gates are usually more widely spaced to allow for more room in the drain areas, thereby allowing for some misalignment of the digit line contact mask. Allowing for more room, however, decreases the number of transistors that can be produced in a given area.

A second method of forming the Flash E²PROM structure is described in the article "A 5-Volt Contactless Array 256 KBIT Flash EEPROM Technology," M. Gill et al, IEDM, 1988, pp. 428. This structure, which is formed with a buried N+ line process, has higher digit line capacitance, more process complexity, and also has a high degree of lateral diffusion in the buried digit line and is not easily scalable.

SUMMARY OF THE INVENTION

An object of the invention is to provide an E²PROM device design and manufacturing process which has reduced misalignment of the gate oxide and of the digit line contact masks.

This and other objects of the present invention are realized from the inventive process for forming a PROM structure and the inventive structure resulting from same. The summary of the process given in this section below assumes various variables, such as a p-type substrate doped with n-type material, which is not necessary for the invention as the substrate could also be n-type with a p-type dopant.

A structure of the invention occurs from a novel nitride deposition pattern over the pad oxide layer. Rows of nitride, rather than the crisscross pattern of previous methods, allows for the formation of alternating rows of field oxide 90 and gate oxide 92, as shown in FIG. 9.

A layer of poly, and a layer of oxide or oxide-nitride-oxide are patterned in rows over and parallel with the rows of gate oxide. Next, blanket layers of poly and oxide are deposited onto the wafer surface, photoresist is patterned onto the surface, and the layers are etched to form columns running perpendicular to the rows of field oxide. In the prior processes, this layer of photoresist must be aligned with the columns of gate oxide to ensure that the control gates (word lines) are properly positioned in relation to what will be the source lines. In the inventive process this alignment is not necessary since there are no structures running in the same direction as the word lines with which to align. During the etch of P2, P1 is also etched, which forms the floating gates at the junctions of the word line poly and the rows of gate oxide.

Next, a light thermal oxidation is followed by a spacer formation and a doping step, and a layer of oxide is patterned onto the wafer surface which leaves the transistor source areas exposed. A third poly layer is patterned onto the surface so as to couple the source areas within a single column. The poly is insulated, and the digit lines are formed to couple the transistor drains according to accepted wafer fabrication techniques.

One feature of the inventive structure is the transistor source "islands." Normally, the N+ source regions for all the transistors in a single column are the same electrical point resulting from coupling during the doping step. In the present invention, the source regions must be coupled with a conductive substance such as poly or poly and tungsten silicide (hereafter, polycide) as a later step in the fabrication process in order to couple them electrically. These source islands are an artifact of the inventive manufacturing process which allows self-alignment of each control gate to the active area. In previous processes the gate oxide is etched away to bare silicon before the doping step to form the source regions in columns while the field oxide is discontinuous. In the inventive process, the field oxide is formed in continuous rows and therefore causes discontinuous areas of bare silicon in the column direction which will become the transistor sources. A conductive layer is added in a later step to couple the source regions. The conductive layer, such as poly or polycide, is a much better conductor having improved electrical characteristics and therefore forms a transistor with a more desirable electrical characteristic than previous designs using doped substrate as a source area coupler.

In the present invention, the steps of patterning the pad oxide into alternating rows of field oxide and gate oxide, then adding the P3 layer to later couple the source lines replaces the very critical patterning step of previous production methods which aligns the floating and control gates of a transistor with the active area. Patterning and etching the P2 layer to form the word lines, and etching the P1 layer at the same time to form the floating gates is a noncritical patterning step and has a large room for error. Patterning the P3 layer also has a large room for error, whereas alignment of the control lines with the active area as is done with previous processes is a critical step which has very little room for error.

After etching the P3 layer to form the conductive source lines, a layer of oxide is formed on the wafer surface, and a layer of photoresist is patterned over the oxide. The contact areas to the drain regions are left exposed, and the oxide is etched away to bare silicon substrate. This is a noncritical pattern with a large room for error, as the oxide cap covering the word lines prevents the etch from exposing P2. This oxide is thicker than the oxide covering the drain regions, and a short etch to expose the drain regions will not expose P2. Since the metal contact of conventional technology is replaced with the buried contact of the invention, a reasonable amount of misalignment will not adversely affect the functionality of the cell. The density of the transistors can therefore be more dense, and the physical size of the array can be decreased.

Finally, a P4 layer is formed, and a patterned layer of resist defines the digit lines. A poly etch of P4 forms the digit lines.

DETAILED DESCRIPTION OF THE INVENTION

The inventive structure can formed with the following inventive steps.

First, a wafer is manufactured according to accepted methods of MOS wafer fabrication for use as an EPROM or Flash $E^2$PROM up to and including the step of pad oxide formation.

Figure 1:
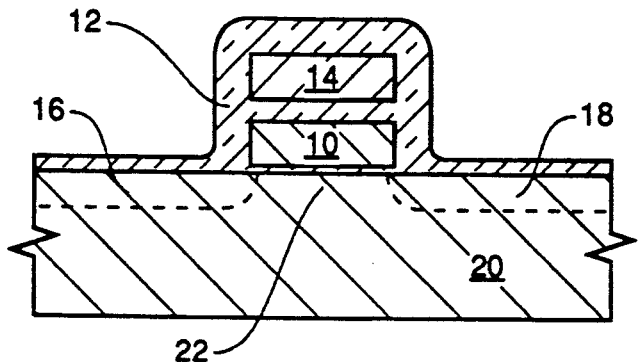
FIG. 1 shows a cross section of a programmable read-only memory having a pair of gates.
Figure 2:
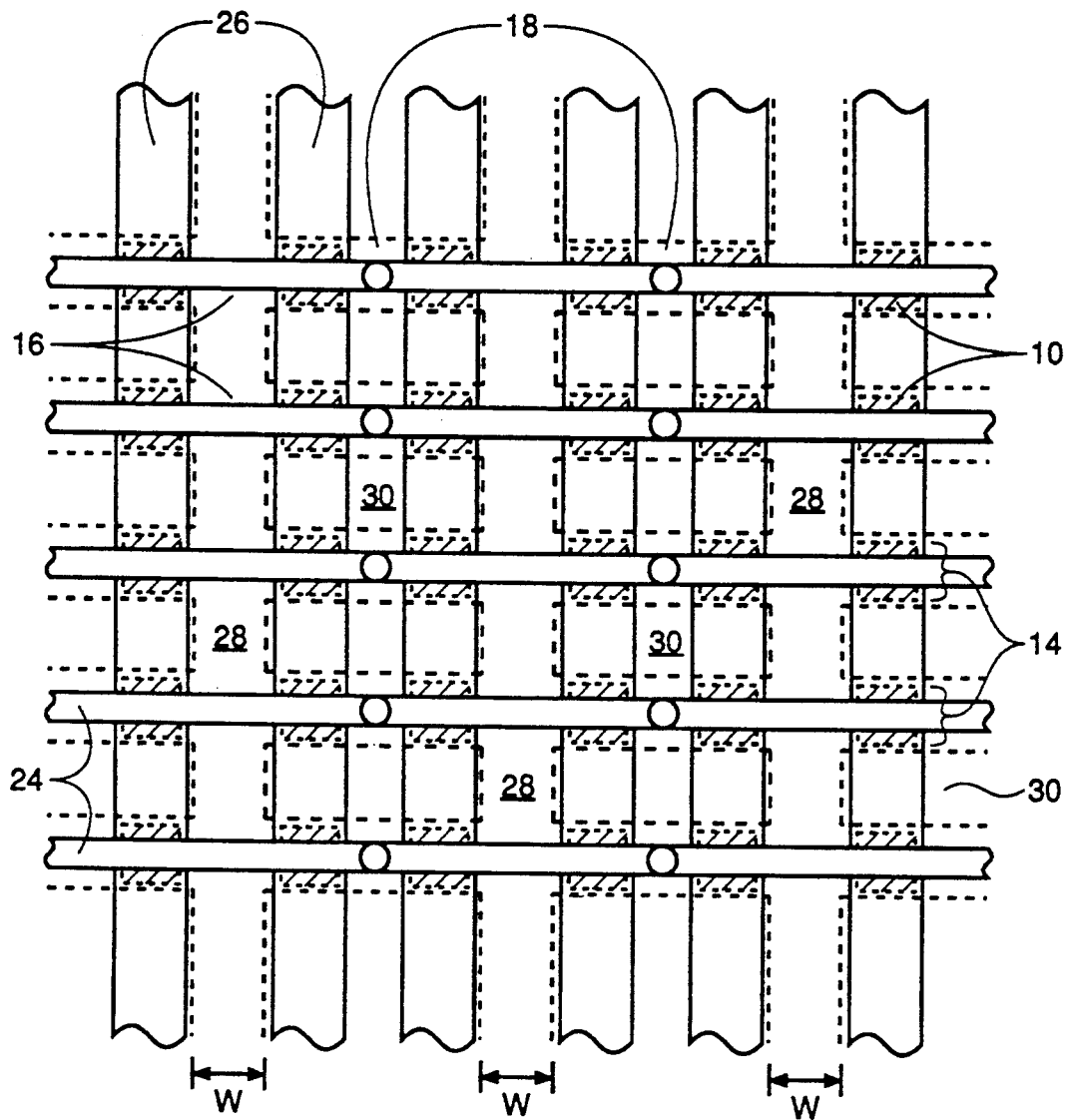
FIG. 2 shows a plan view of a conventional programmable read-only memory.
Figure 3:
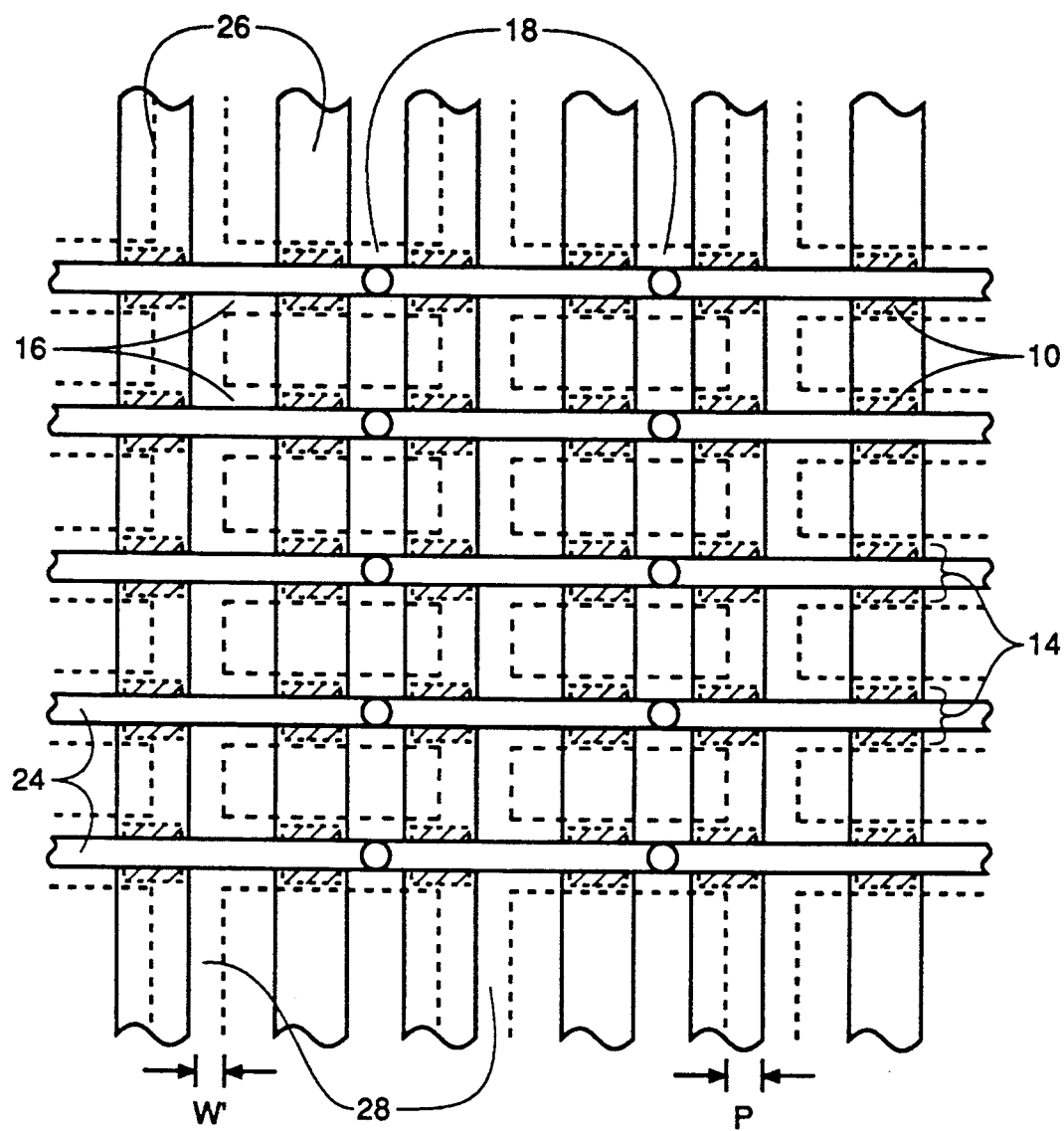
FIG. 3 shows the device of FIG. 2 wherein the surface structures are misaligned to the active area of the wafer.
Figure 4:
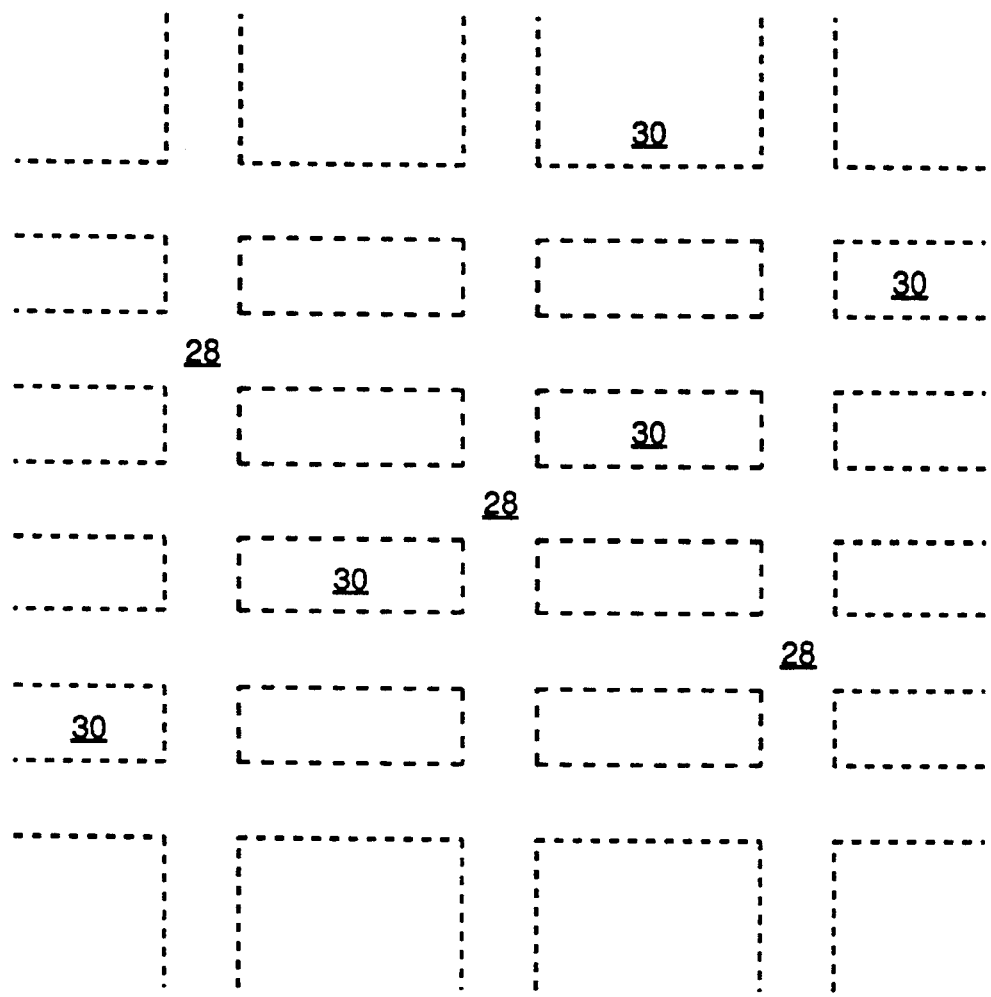
FIG. 4 shows the pattern defined by the gate oxide (active area) and the field oxide of the wafer which will form a conventional programmable read-only memory structure.
Figure 5A:
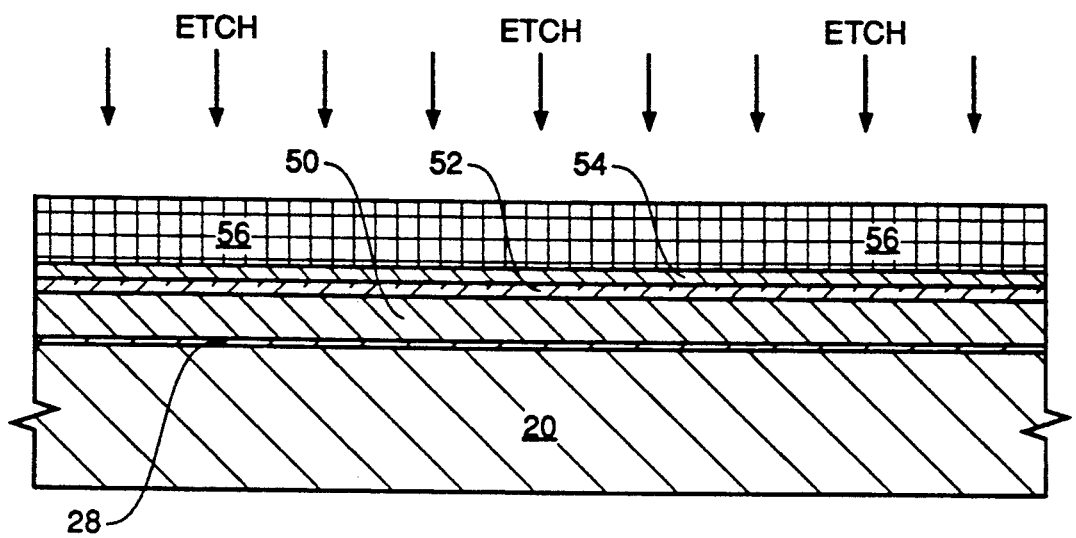
FIG. 5A describes a cross section of a first set of steps to form a conventional programmable read-only memory.
Figure 5B:
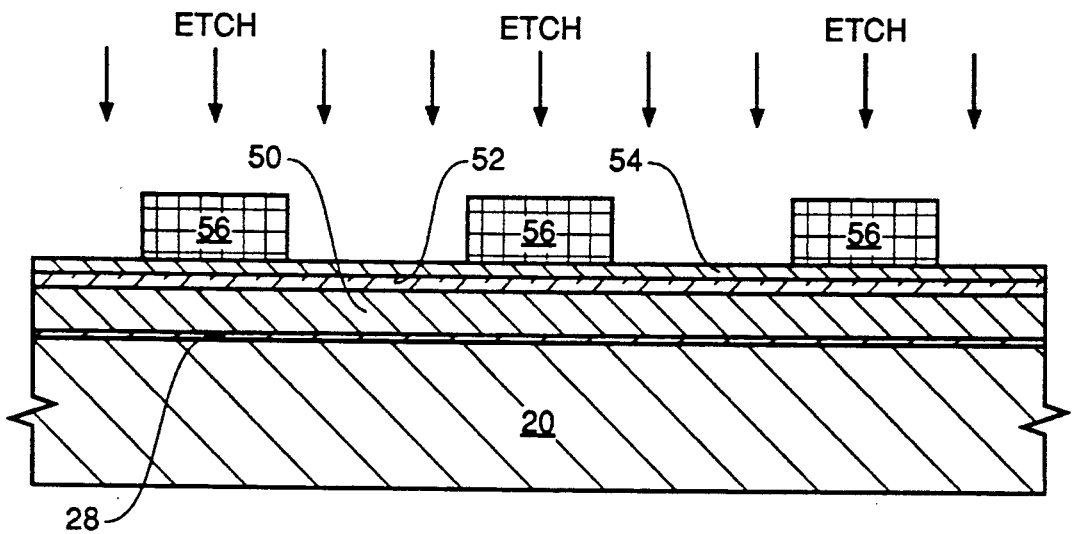
FIG. 5B shows a cross section of the FIG. 5A device, the view being perpendicular to the FIG. 5A view.
Figure 6:
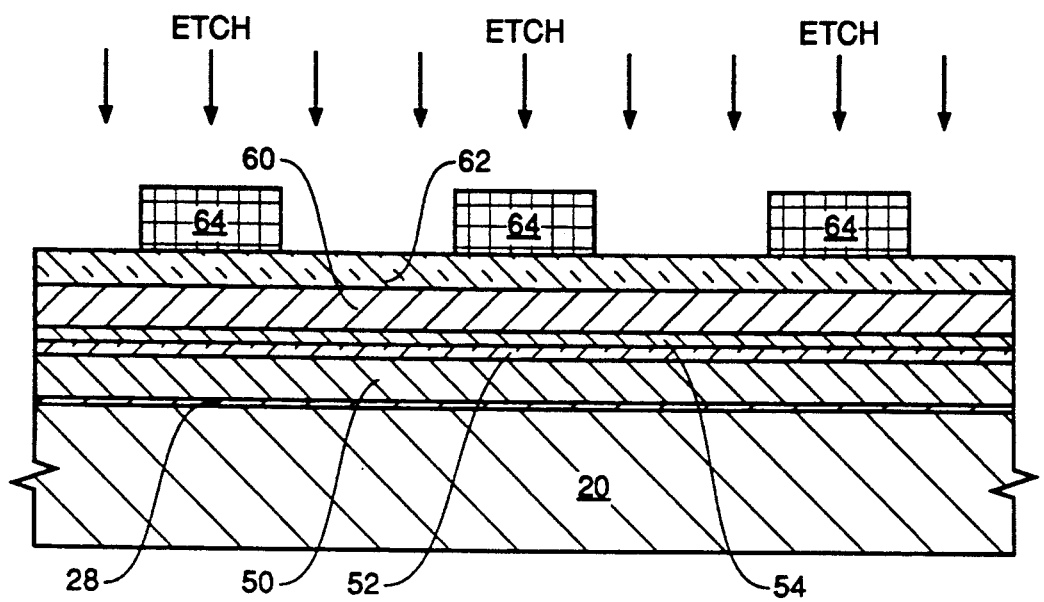
FIG. 6 shows a cross section of a second set of steps to form a conventional programmable read-only memory.
Figure 7:
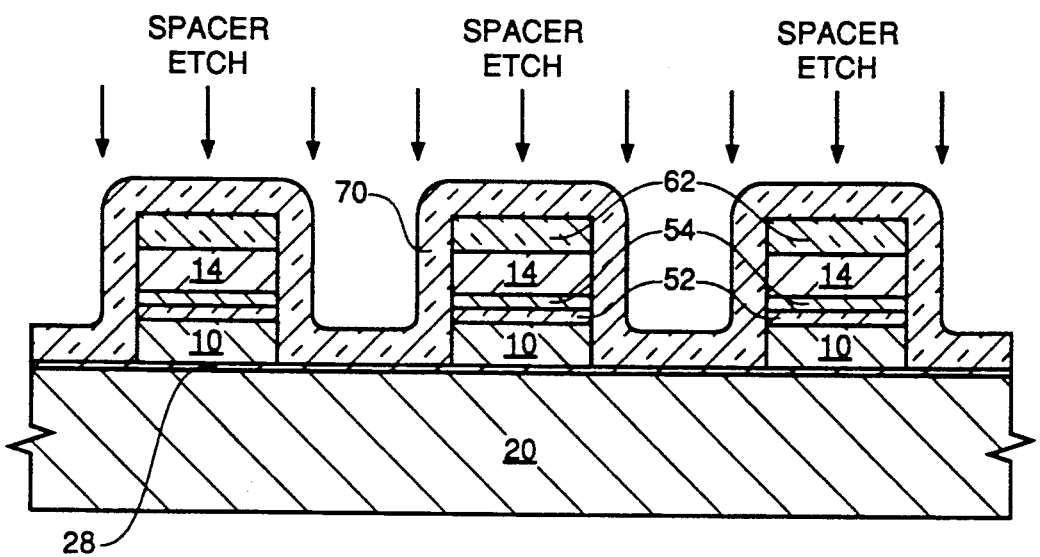
FIG. 7 shows a third set of steps to form a conventional programmable read-only memory.
Figure 8:
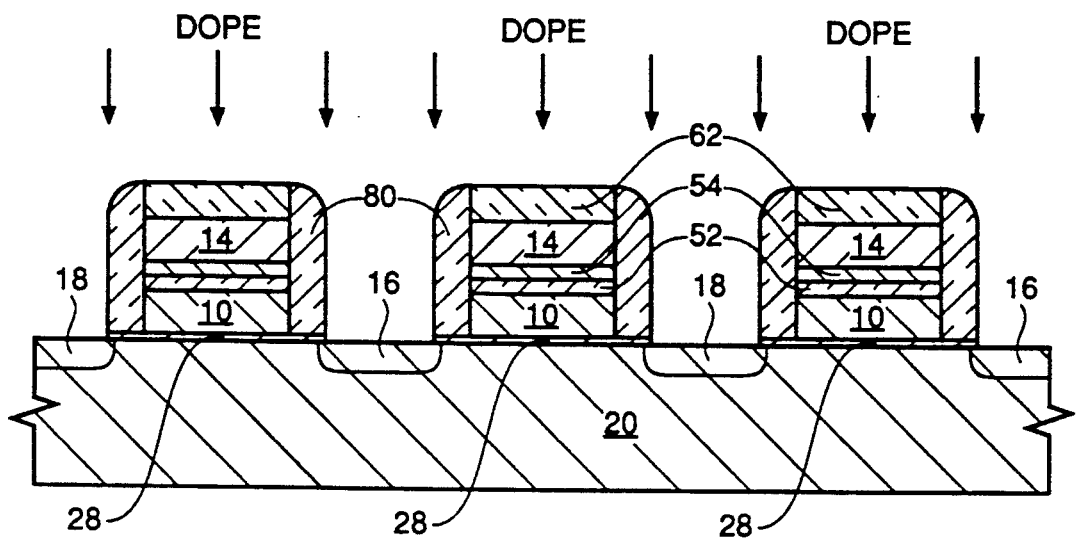
FIG. 8 shows a fourth set of steps to form a conventional programmable read-only memory.
Figure 9:
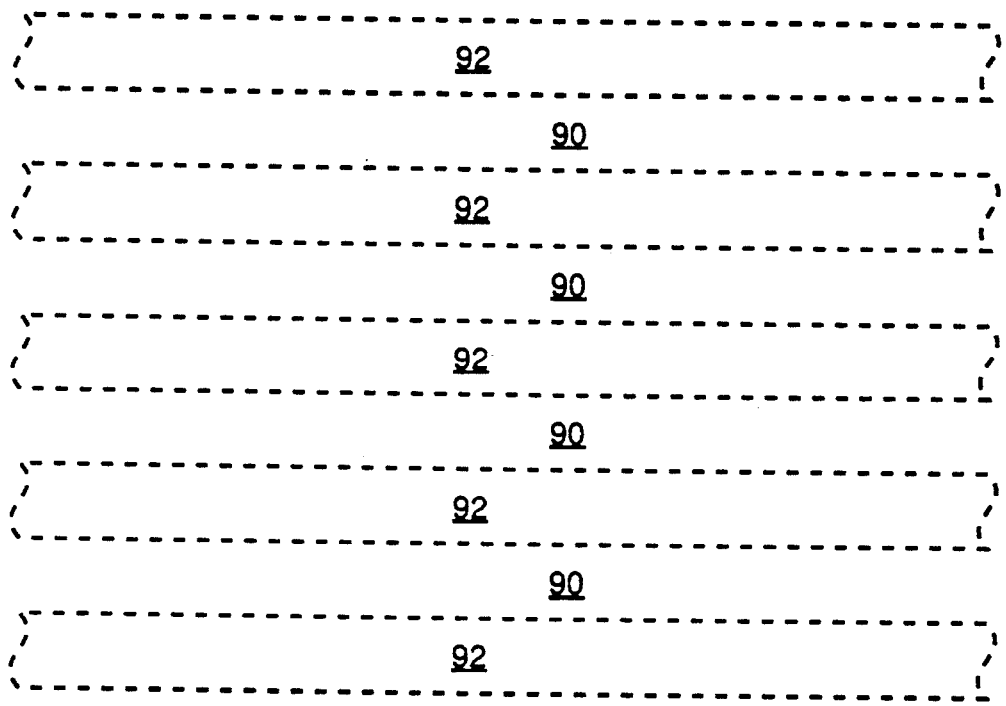
FIG. 9 describes the pattern defined by the gate oxide and field oxide of the wafer which will form an inventive programmable read-only memory structure.

Rows of nitride are formed over the pad oxide, and field oxide is formed from the exposed regions of oxide. This process leaves alternating rows of field oxide and gate oxide and a substrate of p-type material as shown in FIG. 9.

Figure 10A:
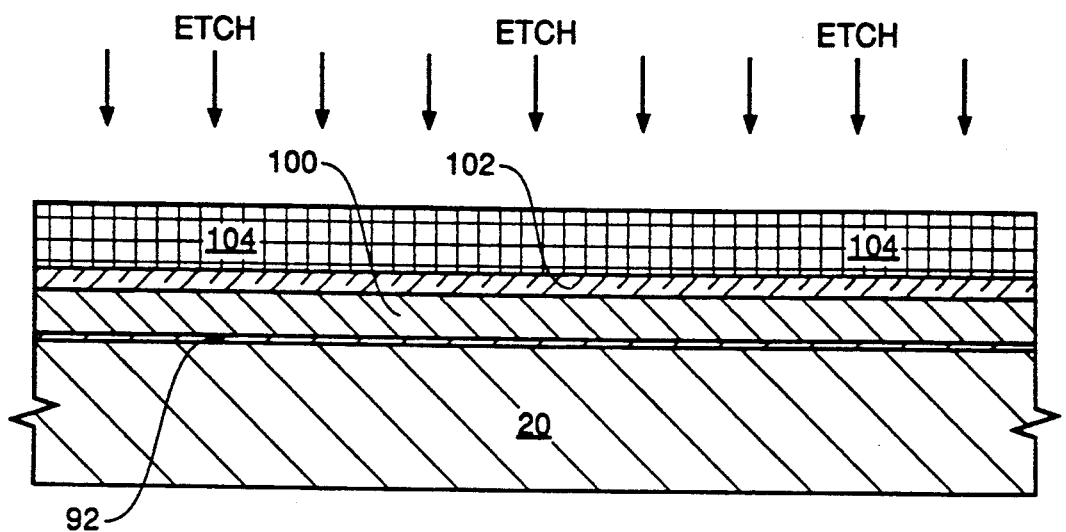
FIG. 10A describes a cross section of a first set of steps to form an inventive programmable read-only memory.
Figure 10B:
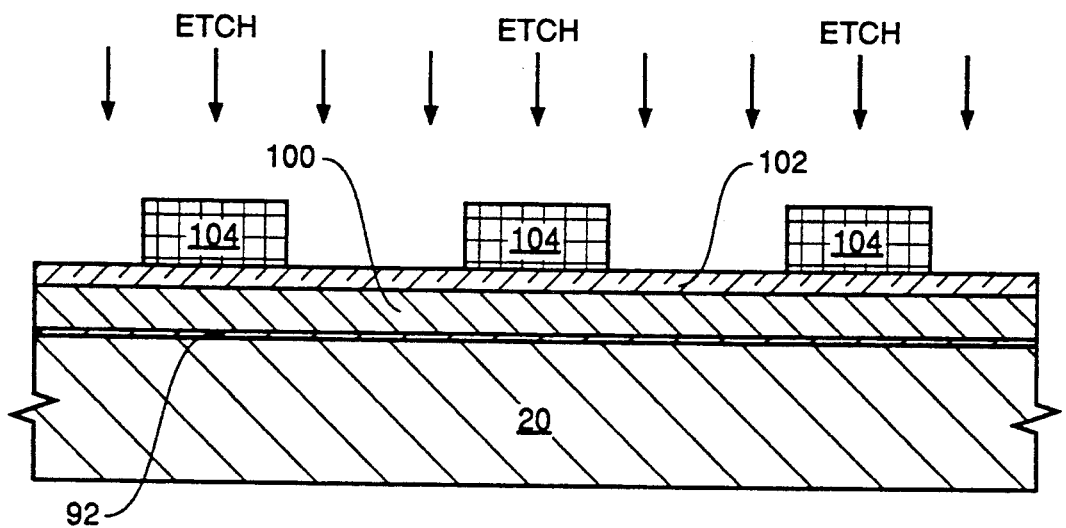
FIG. 10B shows a cross section of the FIG. 10A device, the view being perpendicular to the FIG. 10A view.

As shown in FIGS. 10A and 10B, a layer of poly 100, P1, and a layer of oxide, oxide-nitride sandwich, or oxide-nitride-oxide 102 (hereafter, ONO) on top of the P1 layer 100 are formed in rows over and parallel with the gate oxide 92, the ONO layer 102 being a layer of nitride sandwiched between two oxide layers (but shown in the Figures as a single layer). These structures can be formed by depositing blanket layers of poly and ONO, patterning a layer of photoresist 104, and etching the layers.

Figure 11:
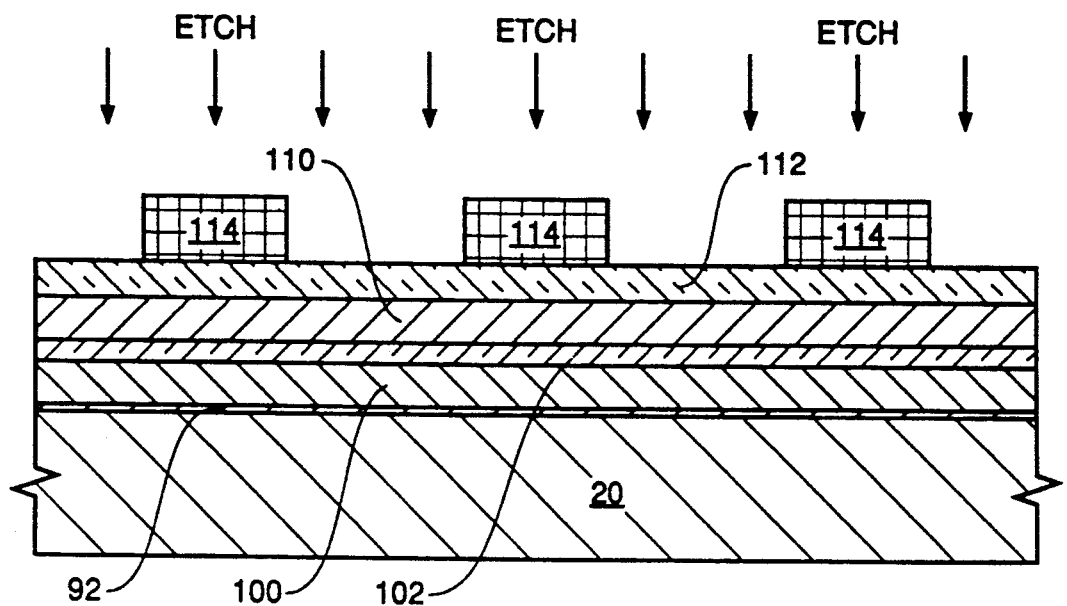
FIG. 11 shows a cross section of a second set of steps to form an inventive programmable read-only memory.

Referring to FIG. 11, a P1 sidewall oxidation (not shown) is performed, a blanket second layer of poly 110, P2, and a layer of oxide 112 on top of the P2 layer 110 are formed, P2 110 later forming the control gates 14 and the oxide 112 protecting the P2 110 in later etch steps. The oxide layer 112, P2 layer 110, ONO layer 102, and P1 layer 100 are etched in a pattern of columns which are perpendicular to the rows of gate oxide 92 (or active area), thereby resulting in isolated rectangles of P1, which will form the PROM floating gates 10, and columns of P2, which will form the control gates 14.

Figure 12:
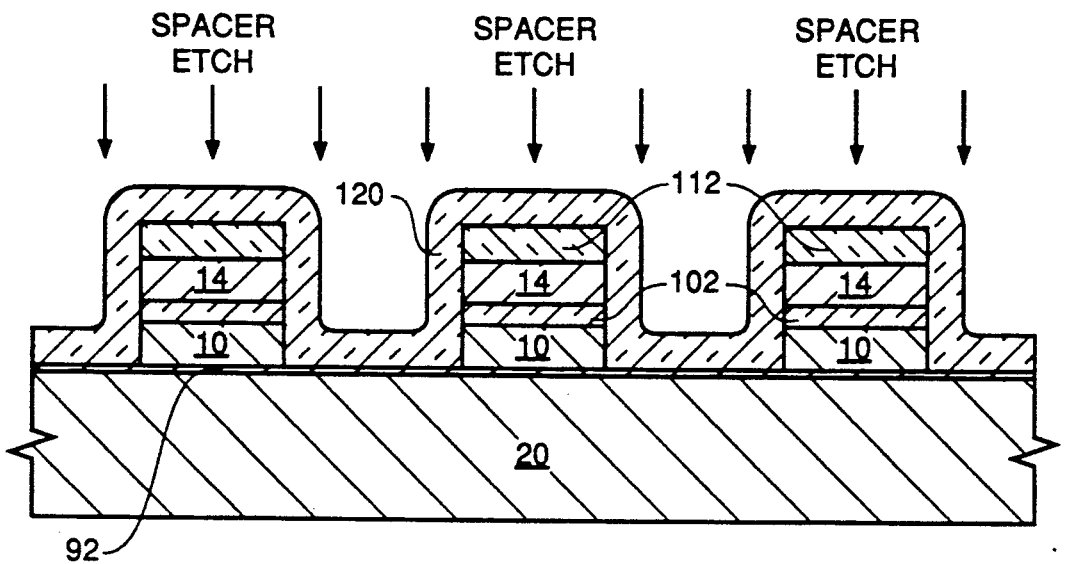
FIG. 12 shows a cross section of a third set of steps to form an inventive programmable read-only memory.
Figure 13:
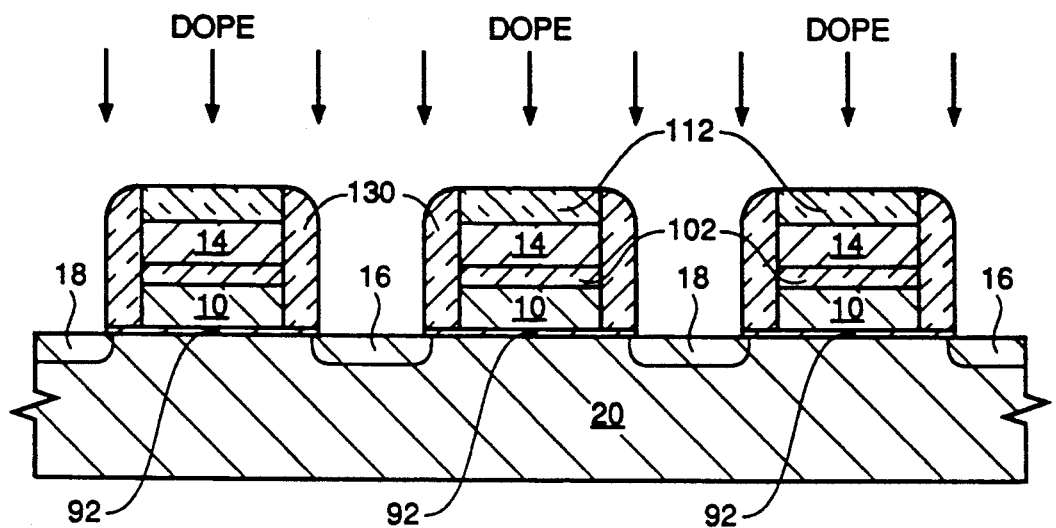
FIG. 13 shows a cross section of a fourth set of steps to form an inventive programmable read-only memory.

As shown in FIG. 12, a blanket layer of oxide 120 is deposited and etched to form spacers on the poly-oxide pillars. This etch also etches the gate oxide 92 not protected by poly, and leaves rectangular areas of bare silicon which will later define the transistor source 16 and drain 18 regions. The thicker field oxide 90 is also somewhat etched, but remains substantially intact. The amount of field oxide 90 removed is approximately equal to the thickness of the gate oxide 92 removed. FIG. 13 shows the spacers 130 resulting from the spacer etch.

The exposed silicon is doped with any workable dopant to form the source 16 and drain 18 regions of FIG. 13. For an embodiment comprising a p-type substrate, Arsenic, Phosphorous, or other materials may be sufficient as n-type dopants. For an embodiment comprising n-type substrate, Boron or other materials may be sufficient as p-type dopants. The other areas of the silicon wafer surface are protected by field oxide 90 and the control gate poly 14 (P2). The N+ doped silicon 16, 18 are self-aligned to the control gates 14 and floating gates 10 and will function as the transistor sources 16 and drains 18.

Figure 14:
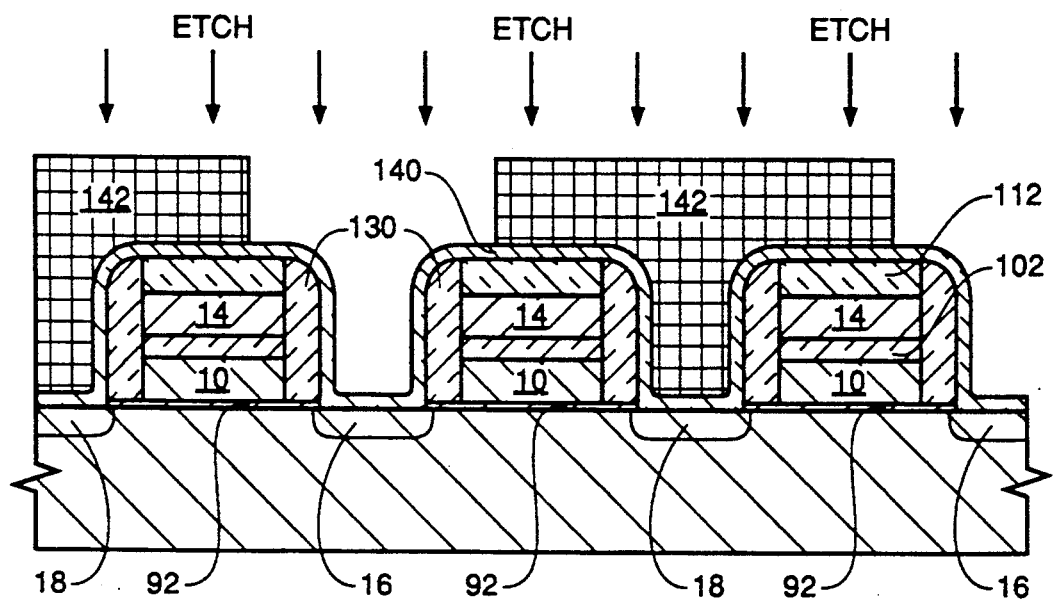
FIG. 14 shows a cross section of a fifth set of steps to form an inventive programmable read-only memory.

As shown in FIG. 14, an etch stop layer 140 is blanket deposited over the surface structures. Layer 140 can be oxide, nitride, or other workable materials. A layer of photoresist 142 is patterned on the wafer surface leaving the area over the source regions 16 exposed. An etch removes the oxide 140 covering the source regions 16 to bare silicon, and possibly removes a certain amount of the oxide 112 which is over the P2 control gates 14. The layer of oxide 112 over the second poly layer 14 therefore protects the P2 layer 14 during this etch step. As a result of several factors, the patterning of this resist 142 has a large allowance for error, and the width of the area through the resist can be adjusted for maximum die yield. Generally, the area can be very wide, but not so wide that the largest misalignment of the resist mask will allow etching through the oxide 140 over the drain regions 18.

Figure 15:
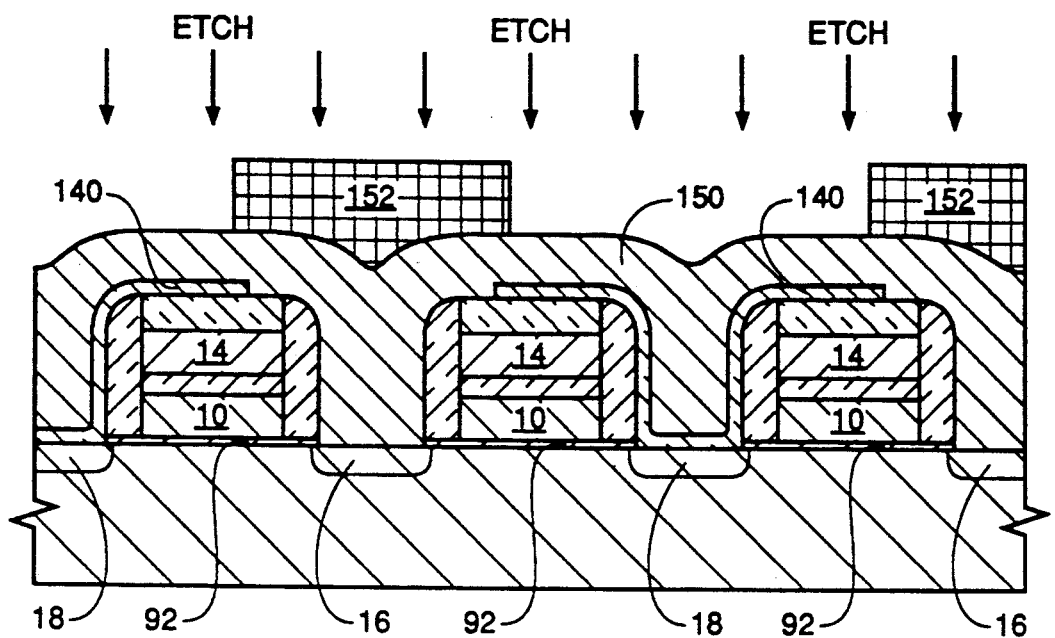
FIG. 15 shows a cross section of a sixth set of steps to form an inventive programmable read-only memory.
Figure 16:
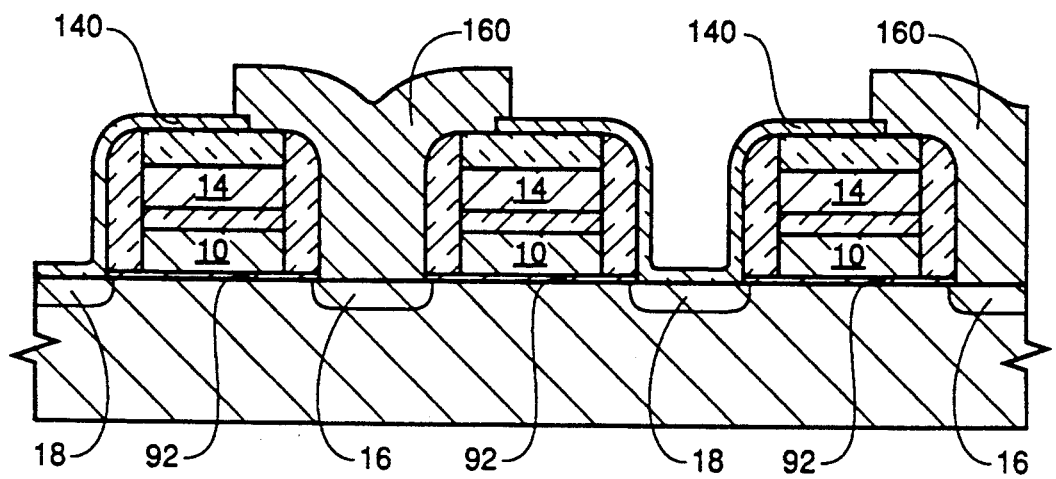
FIG. 16 shows a cross section of an inventive programmable read-only memory fabricated up to the step of a conductive layer which couples the source regions.

As shown in FIG. 15, a blanket third layer of poly 150, P3, or polycide layer patterned with a layer of resist 152 and etched to form the poly structure 160 of FIG. 16. This structure 160 contacts the exposed source regions 16, thereby coupling all source regions within a single row and providing a poly source line. The etch shown is one of various possible ways the P3 structure 160 can be formed. The P3 layer is self-aligned, as the mask which leaves the source area exposed can be misaligned with no adverse effects resulting therefrom.

Figure 17:
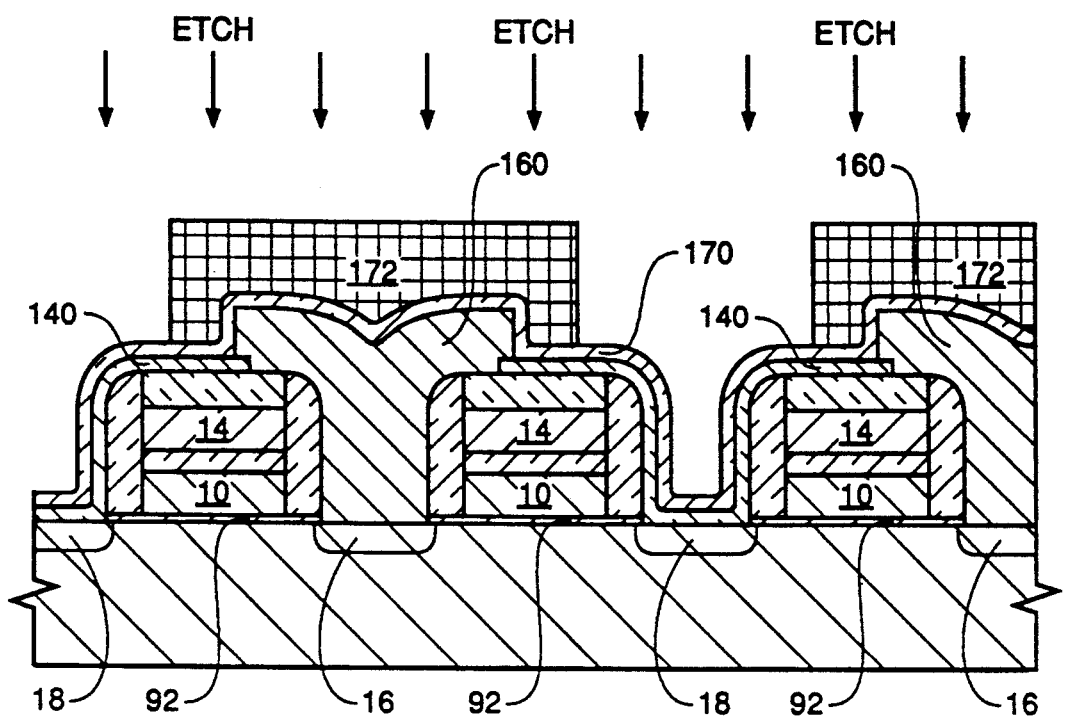
FIG. 17 shows a cross section of the structure of FIG. 16 with the addition of an insulative layer and a resist layer to define the openings over the drain.
Figure 18:
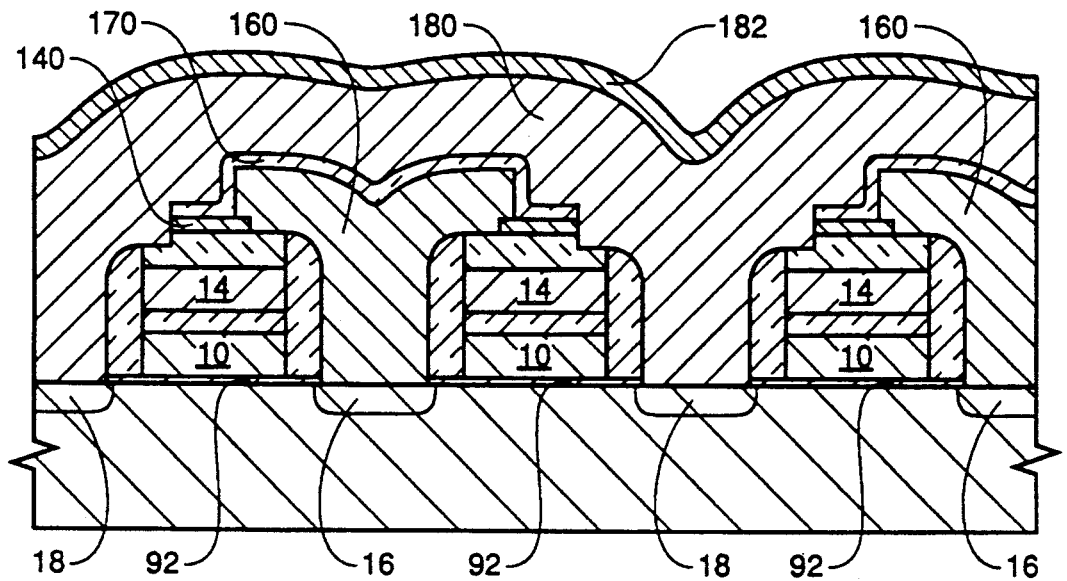
FIG. 18 shows a cross section of the structure of FIG. 17 after exposing the substrate in the drain regions and adding a digit line comprising a pair of materials.

After fabrication of the FIG. 16 structure, a layer of oxide 170 is deposited over the wafer surface as shown in FIG. 17. A layer of photoresist 172 is patterned onto the wafer surface to leave the drain regions exposed. An oxide etch is performed to remove the oxide covering the drain regions. The oxide covering the drain regions is much thinner than the oxide covering the floating gates, and the etch is controlled to prevent the removal of oxide to expose the floating gates. After the oxide etch to expose the drain regions, a patterned layer of P4 poly is formed over the wafer surface thereby defining the digit lines as shown in FIG. 18. An optional layer of titanium silicide (TiSi$_x$) formed over the P4 layer would improve the electrical characteristics of the digit line, thereby making it more conductive. If TiSi$_x$ is used, a layer of between about 1 KÅ to 3 KÅ would be sufficient, although greater and lesser thicknesses would also increase the conductivity of the P4 layer. The P4 layer is self-aligned, as the mask which leaves the drain area exposed can be misaligned with no adverse effects resulting therefrom. The buried contacts between P4 and the drain regions, as well as the buried contacts between P3 and the source regions, are thereby self-aligned.

Figure 19:
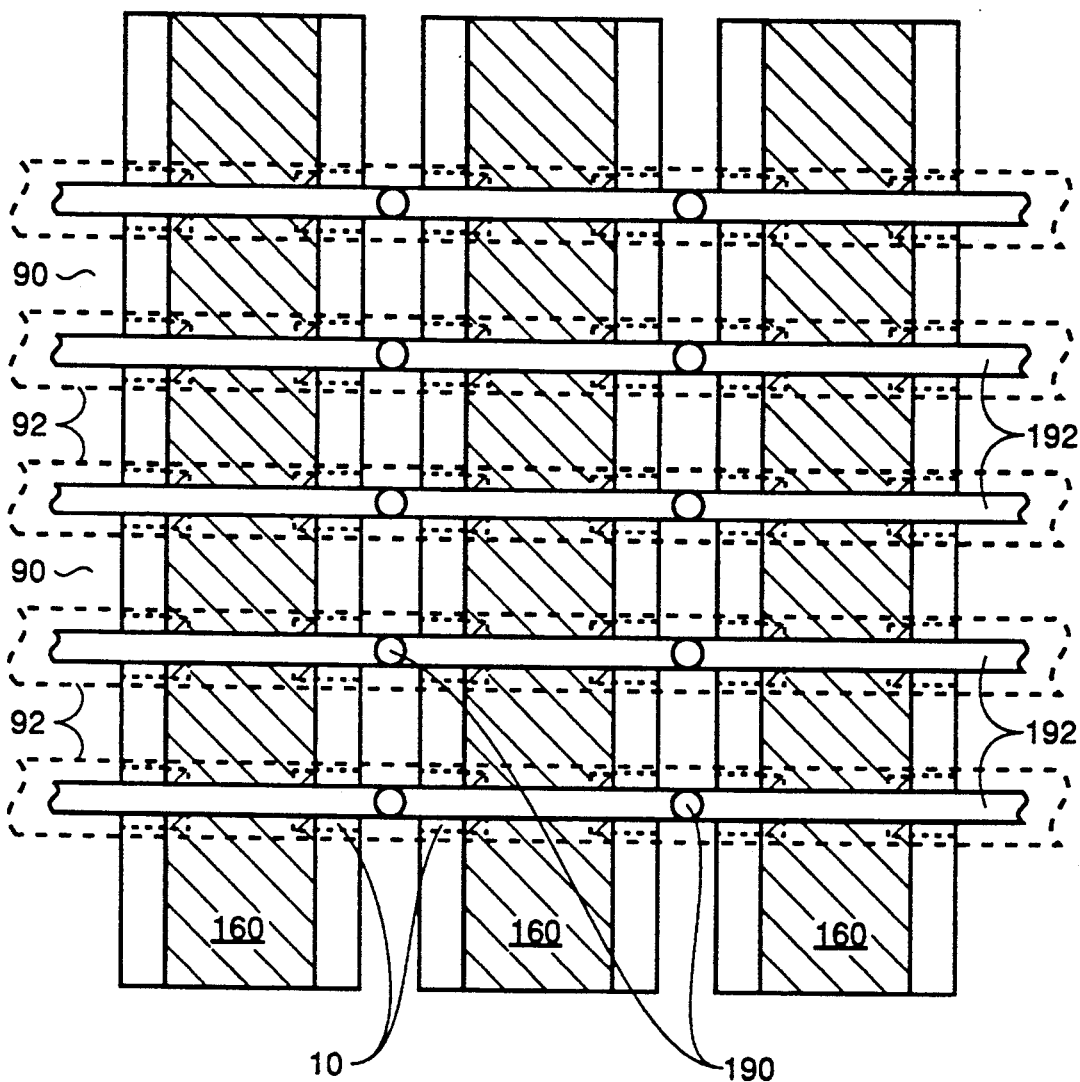
FIG. 19 shows a plan view of the inventive programmable read-only memory fabricated up to the formation of the digit lines.

The steps above result in the structure of FIG. 19. Buried contacts 190 are made to the drain regions 16, and bit lines 192 couple the drain regions within each row. The buried contacts 190 and bit lines 192 are formed according to accepted methods of MOS manufacture.

It is possible to form a PROM structure using similar techniques, except for replacing the P3 structure 150 with a field oxide etch and implant to form columns of source area. This would allow self-alignment of the control lines without the addition of a P3 layer, but would require a field oxide etch.

What have been described are specific configurations of the invention, as applied to particular embodiments. Clearly, variations can be made to the original designs and fabrication processes described herein for adapting the invention to other embodiments. For example, it is possible to start with an N-type substrate and dope the source and drain regions with P+dopant such as Boron. Also, dielectrics other than oxide and ONO can be used, and there may be conductors which can replace the polycrystalline silicon described herein. Several of the features can be deposited, grown, masked, etched, or formed by any workable means using methods other than those described. Therefore, the invention should be read as limited only by the appended claims.

I claim:

1. A process forming a semiconductor memory device, comprising the steps of:
    a) forming a first insulation layer over a substrate, said first insulation layer comprising alternating rows of field and gate insulation;
    b) forming a first conductive layer over said first insulation layer, said first conductive layer comprising conductive rows overlying and parallel with said gate insulation;
    c) forming a second insulation layer over said first conductive layer;
    d) forming a second conductive layer over said second insulation layer;
    e) removing portions of said second conductive layer to form word lines which are perpendicular with said field insulation;
    f) removing portions of said conductive rows to form floating gates at the junctions of said word lines and said gate insulation;
    g) removing portions of said gate insulation which are not protected by said word lines thereby forming areas of exposed substrate segmented in the row direction by said gate insulation and in the column direction by said field insulation;
    h) changing the electrical properties of said exposed substrate areas to form source and drain regions;
    i) forming a third insulation layer over said second conductive layer;
    j) forming a third conductive layer, said third conductive layer forming conductive source lines, each source line coupling a column of source regions;
    k) forming a fourth insulation layer over said third conductive layer; and
    l) forming a fourth conductive layer, said fourth conductive layer forming conductive digit lines, each digit line coupling a row of drain regions.

2. The method of claim 1 wherein said fourth conductive layer comprises silicon.

3. The method of claim 1 wherein said first, second, third, and fourth conductive layers comprise polycrystalline silicon.

4. The method of claim 1 further comprising an etch step after said step k) wherein said etch step exposes said drain regions and allows for self-aligned buried contacts to said drain regions.

5. The method of claim 1 further comprising an etch step after said step i) wherein said etch step exposes said source regions and allows for self-aligned buried contacts to said source regions.

6. The method of claim 1 wherein steps e), f), and g) are performed during a single etch.

7. The method of claim 1 wherein said changing step is accomplished by doping.

8. The method of claim 1 wherein said insulation layers comprise oxide.

9. The method of claim 1 wherein said second insulation layer comprises oxide and nitride.

10. The method of claim 1, further comprising the step of forming a fifth conductive layer over said fourth conductive layer and contacting said fourth conductive layer, said fifth conductive layer being more conductive than said fourth conductive layer.

11. The method of claim 10 wherein said fifth conductive layer comprises titanium.

12. A method of forming a programmable read-only memory device, comprising the steps of:
 a) forming a first insulation layer over a substrate, said first insulation layer comprising alternating rows of field oxide and gate oxide;
 b) forming a first conductive layer over said first insulation layer, said first conductive layer comprising conductive rows overlying and parallel with said gate oxide;
 c) forming a second insulation layer over said first conductive layer;
 d) forming a second conductive layer over said second insulation layer;
 e) removing portions of said second conductive layer to form control gates which are perpendicular with said rows of field oxide;
 f) removing portions of said first conductive layer to form floating gates at the junctions of said control gates and said gate oxide rows;
 g) removing portions of said gate oxide rows which are not protected by said control gates thereby forming areas of exposed substrate segmented in the row direction by gate oxide and in the column direction by field oxide;
 h) doping of said exposed substrate areas to form transistor source and drain regions;
 i) forming a third insulation layer over said second conductive layer;
 j) forming a third conductive layer, said third conductive layer forming conductive source lines, each source line coupling a column of source regions;
 k) forming a fourth insulation layer over said third conductive layer; and
 l) forming a fourth conductive layer, said fourth conductive layer forming conductive digit lines, each digit line coupling a row of drain regions.

13. The method of claim 12 wherein said fourth conductive layer comprises silicon.

14. The method of claim 12 wherein said first, second, third, and fourth conductive layers comprise polycrystalline silicon.

15. The method of claim 12 wherein steps e), f), and g) are performed during a single etch.

16. The method of claim 12 wherein said insulation layers comprise oxide.

17. The method of claim 12 wherein said second insulation layer comprises oxide and nitride.

18. The method of claim 12 further comprising an etch step after said step k) wherein said etch step exposes said drain regions and allows for self-aligned buried contacts to said drain regions.

19. The method of claim 12 further comprising an etch step after said step i) wherein said etch step exposes said source regions and allows for self-aligned buried contacts to said source regions.

20. The method of claim 12, further comprising the step of forming a fifth conductive layer over said fourth conductive layer and contacting said fourth conductive layer, said fifth conductive layer being more conductive than said fourth conductive layer.

21. The method of claim 12 wherein said fifth conductive layer comprises titanium.

* * * * *